United States Patent
Jin et al.

(10) Patent No.: US 12,447,739 B2
(45) Date of Patent: Oct. 21, 2025

(54) DROPLET ANALYSIS UNIT AND SUBSTRATE TREATMENT APPARATUS INCLUDING THE SAME

(71) Applicant: SEMES CO., LTD., Cheonan-si (KR)

(72) Inventors: Won Yong Jin, Cheonan-si (KR); Jae Duck Lee, Cheonan-si (KR); Suk Won Jang, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 132 days.

(21) Appl. No.: 18/346,984

(22) Filed: Jul. 5, 2023

(65) Prior Publication Data

US 2024/0034056 A1    Feb. 1, 2024

(30) Foreign Application Priority Data

Jul. 27, 2022    (KR) .......................... 10-2022-0093076

(51) Int. Cl.
| | |
|---|---|
| *B41J 2/045* | (2006.01) |
| *B41J 25/00* | (2006.01) |
| *G02B 27/00* | (2006.01) |
| *H04N 23/63* | (2023.01) |

(52) U.S. Cl.
CPC ....... *B41J 2/04561* (2013.01); *B41J 2/04558* (2013.01); *B41J 25/001* (2013.01); *G02B 27/0025* (2013.01); *H04N 23/631* (2023.01)

(58) Field of Classification Search
None
See application file for complete search history.

(56) References Cited

U.S. PATENT DOCUMENTS

| | | | |
|---|---|---|---|
| 9,278,670 B2 | 3/2016 | Hattori et al. | |
| 2022/0072884 A1* | 3/2022 | Byeon | B41J 29/393 |
| 2022/0414380 A1* | 12/2022 | Price | G06F 18/214 |

FOREIGN PATENT DOCUMENTS

| | | |
|---|---|---|
| JP | 2006170756 A | 6/2006 |
| JP | 2011244417 A | 12/2011 |
| KR | 10-2011-0001445 A | 1/2011 |
| KR | 10-2011-0023910 A | 3/2011 |
| KR | 101824328 B1 | 2/2018 |
| KR | 10-2020-0144198 A | 12/2020 |
| KR | 20220099892 A | 7/2022 |

OTHER PUBLICATIONS

Notice of Allowance for Korean Application No. 10-2022-0093076 dated Aug. 20, 2025.

* cited by examiner

*Primary Examiner* — Scott A Richmond
(74) *Attorney, Agent, or Firm* — Harness, Dickey & Pierce, P.L.C.

(57) ABSTRACT

A droplet analysis unit capable of measuring and digitizing the meniscus shape, motion, and position of ink droplets and a substrate treatment apparatus including the droplet analysis unit are provided. The substrate treatment apparatus includes: a process treatment unit supporting a substrate while the substrate is being treated; an inkjet head unit treating the substrate by ejecting a substrate treatment liquid onto the substrate using a plurality of nozzles; a gantry unit moving the inkjet head unit over the substrate; and a droplet analysis unit measuring a meniscus in each of the nozzles that is associated with the substrate treatment liquid, wherein the droplet analysis unit measures and quantifies three-dimensional (3D) information regarding the meniscus based on chromatic aberration.

18 Claims, 14 Drawing Sheets

DROPLET ANALYSIS UNIT AND SUBSTRATE TREATMENT APPARATUS INCLUDING THE SAME

CROSS-REFERENCE TO RELATED APPLICATION

This application claims priority from Korean Patent Application No. 10-2022-0093076 filed on Jul. 27, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a droplet analysis unit and a substrate treatment apparatus including the same, and more particularly, to a droplet analysis unit capable of measuring the meniscus motion of ink droplets and a substrate treatment apparatus including the droplet analysis unit.

2. Description of the Related Art

To fabricate a display device such as a liquid crystal display (LCD) panel or a light-emitting diode (LED) display panel, a printing process may be performed on a transparent substrate using inkjet equipment. The inkjet equipment may perform a patterning process (e.g., red-green-blue (RGB) patterning) by ejecting fine droplets of ink to each desired location on the transparent substrate with the use of an inkjet head.

The inkjet head ejects ink in the form of droplets through multiple nozzles by converting an electrical signal into a physical force. However, when the ink exhibits an unstable motion in the nozzles of the inkjet head, the ink may not be able to be uniformly ejected through the nozzles, causing defects.

To address this, a method to measure the meniscus motion of ink droplets may be used. Once the physical properties of ink are analyzed by measuring the meniscus motion of ink droplets, the ejection characteristics of inkjet heads can be improved, and the quality of products can be improved.

A drop watcher system may be used to measure the meniscus motion of ink droplets. However, the drop watcher system infers the shape of a meniscus from the contrast ratio of an image captured by a camera, and it is generally difficult to measure the shape, motion, and position of a meniscus with the drop watcher system.

SUMMARY

Aspects of the present disclosure provide a droplet analysis unit capable of measuring and digitizing the meniscus shape, motion, and position of ink droplets, and a substrate treatment apparatus including the droplet analysis unit.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a substrate treatment apparatus includes: a process treatment unit supporting a substrate while the substrate is being treated; an inkjet head unit treating the substrate by ejecting a substrate treatment liquid onto the substrate using a plurality of nozzles; a gantry unit moving the inkjet head unit over the substrate; and a droplet analysis unit measuring a meniscus in each of the nozzles that is associated with the substrate treatment liquid, wherein the droplet analysis unit measures and quantifies three-dimensional (3D) information regarding the meniscus based on chromatic aberration.

According to another aspect of the present disclosure, a substrate treatment apparatus includes: a process treatment unit supporting a substrate while the substrate is being treated; an inkjet head unit treating the substrate by ejecting a substrate treatment liquid onto the substrate using a plurality of nozzles; a gantry unit moving the inkjet head unit over the substrate; and a droplet analysis unit measuring a meniscus in each of the nozzles that is associated with the substrate treatment liquid, wherein the droplet analysis unit measures and quantifies a shape, a motion, and a position of the meniscus based on chromatic aberration as 3D information regarding the meniscus and includes an image acquisition module, which acquires a 3D image of the meniscus, a glass module, which covers an outer exposed surface of the image acquisition module, a transmittance measurement module, which measures a transmittance of the glass module, a cleaning liquid spray module, which sprays a cleaning liquid onto the glass module and is driven based on the transmittance of the glass module, and a cleaning module, which cleans the surface of the glass module with the cleaning liquid and is driven based on the transmittance of the glass module, and the image acquisition module includes a light output module, which outputs light, a lens module, which guides the light toward the meniscus and causes the chromatic aberration, a light detection module, which detects the light, a light division module, which guides the light toward the lens module and guides reflected light from the meniscus toward the light detection module, a first filter, which is disposed between the light division module and the light detection module and includes at least one pin hole for transmitting the light therethrough, and an analysis module, which quantifies the 3D information regarding the meniscus by analyzing the light detected by the light detection module.

According to another aspect of the present disclosure, a drop analysis unit includes: an image acquisition module acquiring a three-dimensional (3D) image of a meniscus in each of a plurality of nozzles of an inkjet head unit, which is for treating a substrate, the meniscus being associated with a substrate treatment liquid; a glass module covering an outer exposed surface of the image acquisition module; a transmittance measurement module measuring a transmittance of the glass module; a cleaning liquid spray module spraying a cleaning liquid onto the glass module, the cleaning liquid spray module being driven based on the transmittance of the glass module; and a cleaning module cleaning the surface of the glass module with the cleaning liquid, the cleaning module being driven based on the transmittance of the glass module, wherein a plurality of light output modules are provided in the image acquisition module to acquire the 3D image and are arranged perpendicularly to a direction in which the substrate treatment liquid drops.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
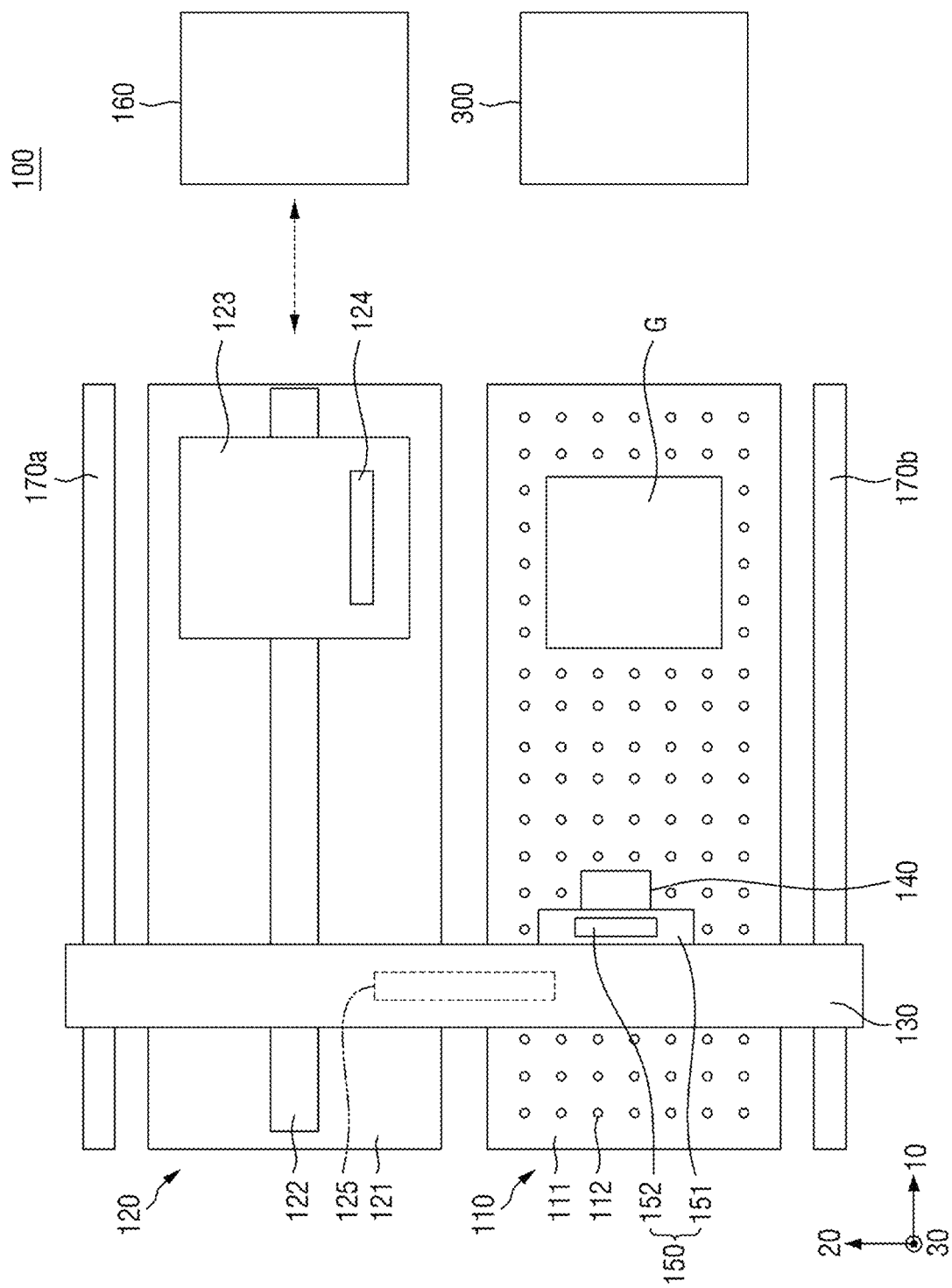
FIG. 1 is a plan view of a substrate treatment apparatus according to an embodiment of the present disclosure.

Embodiments of the present disclosure will hereinafter be described with reference to the attached drawings. Like reference numerals indicate like elements throughout the present disclosure, and thus, descriptions thereof will not be repeated.

The present disclosure relates to a droplet analysis unit capable of measuring the meniscus motion of ink droplets and a substrate treatment apparatus including the droplet analysis unit, and more particularly, to a droplet analysis unit capable of measuring and digitizing the meniscus shape, motion, and position of ink droplets, and a substrate treatment apparatus including the droplet analysis unit.

A substrate treatment apparatus according to an embodiment of the present disclosure will hereinafter be described with reference to the accompanying drawings. FIG. 1 is a plan view of a substrate treatment apparatus according to an embodiment of the present disclosure.

Referring to FIG. 1, a substrate treatment apparatus 100 may include a process treatment unit 110, a maintenance unit 120, a gantry unit 130, an inkjet head unit 140, a substrate treatment liquid supply unit 150, a control unit 160, and a droplet analysis unit 300.

The substrate treatment apparatus 100 treats a substrate G (e.g., a glass substrate) for use in the fabrication of a display device. The substrate treatment apparatus 100 may be provided as inkjet equipment performing a printing process on the substrate G by ejecting a substrate treatment liquid onto the substrate G via the inkjet head unit 140.

The substrate treatment apparatus 100 may use ink as the substrate treatment liquid. Here, the substrate treatment liquid may be a chemical liquid used to perform printing on the substrate G. The substrate treatment liquid may be, for example, quantum-dot (QD) ink containing ultrafine semiconductor particles, and the substrate treatment apparatus 100 may be provided as, for example, inkjet equipment forming color filters CF on the substrate G using the QD ink. The substrate treatment apparatus 100 may print pixels on the substrate G using the substrate treatment liquid and may be provided as circulatory inkjet equipment for preventing nozzles from being clogged by the substrate treatment liquid.

The process treatment unit 110 supports the substrate G while a printing process is being performed on the substrate G. The printing process refers to a process of performing printing on the substrate G using the substrate treatment liquid.

The process treatment unit 110 may support the substrate G in a non-contact manner. The process treatment unit 110 may lift up and support the substrate G using, for example, the air, but the present disclosure is not limited thereto. Alternatively, the process treatment unit 110 may support the substrate G in a contact manner. The process treatment unit 110 may support the substrate G using, for example, a support member with a seating surface thereon.

The process treatment unit 110 may move the substrate G, supporting the substrate G with the air. The process treatment unit 110 may include, for example, a first stage 111 and air holes 112.

The first stage 111 may be provided as a base on which to accommodate the substrate G. The air holes 112 may be formed to penetrate the upper surface of the first stage 111, and a plurality of air holes 112 may be formed in a printing zone on the first stage 111.

The air holes 112 may spray the air in an upward direction of the first stage 111, i.e., in a third direction 30. The air holes 112 may lift the substrate G on the first stage 111 up in the air.

Although not specifically illustrated in FIG. 1, the process treatment unit 110 may further include a gripper and a guide rail. The gripper may grip the substrate G and may thus prevent the substrate G from escaping the first stage 111 when the substrate G is moving along the length direction of the first stage 111, i.e., along a first direction 10. The gripper may move in the same direction as the substrate along the guide rail, gripping the substrate G. The gripper and the guide rail may be provided on the outside of the first stage 111.

The maintenance unit 120 measures the ejection position (or spot) of the substrate treatment liquid on the substrate G and whether the substrate treatment liquid has been ejected. The maintenance unit 120 may measure the ejection position (or spot) of the substrate treatment liquid on the substrate G and whether the substrate treatment liquid has been ejected, for each of a plurality of nozzles provided in the inkjet head unit 140, and may provide the results of the measurement to the control unit 160.

The maintenance unit 120 may include a calibration board with a plurality of alignment marks displayed thereon for measuring the ejection position of the substrate treatment liquid and a vision module for capturing an image of the alignment marks. The maintenance unit 120 may include, for example, a second stage 131, a third guide rail 122, a first plate 123, a calibration board 124, and a vision module 125.

The second stage 121, like the first stage 111, may be a base. The second stage 121 may be arranged in parallel to the first stage 111. The second stage 121 may include a maintenance zone thereon. The second stage 121 may have the same size as the first stage 111. Alternatively, the second stage 121 may have a smaller or greater size than the first stage 111.

The third guide rail 122 guides the movement path of the first plate 123. The third guide rail 122 may be provided on the second stage 121 as at least one line along the length direction of the second stage 121 (i.e., along the first direction 10). The third guide rail 122 may be implemented as, for example, a linear motor (LM) guide system.

Although not specifically illustrated in FIG. 1, the maintenance unit 120 may further include a fourth guide rail. The fourth guide rail, like the third guide rail 122, may guide the movement path of the first plate 123. The fourth guide rail may be provided on the second stage 121 as at least one line along the width direction of the second stage 121 (i.e., along a second direction 20).

The first plate 123 may move along the second stage 121 along the third guide rail 122 and/or the fourth guide rail. The first plate 123 may move along the third guide rail 122 in parallel to the substrate G and may approach the substrate G or move away from the substrate G along the fourth guide rail.

The calibration board 124 is for measuring the ejection position of the substrate treatment liquid on the substrate G. The calibration board 124 may include alignment marks or a ruler and may be provided on the first plate 123 along the length direction of the first plate 123 (i.e., along the first direction 10).

The vision module 125 includes a camera module and acquires image information regarding the substrate G. The image information regarding the substrate G may include information regarding whether the substrate treatment liquid has been ejected and the ejection position, amount, and area of the substrate treatment liquid. The vision module 125 may also acquire and provide information regarding the calibration board 124.

The vision module 125 may acquire the image information regarding the substrate G in real time when treating the substrate G. The vision module 125 may acquire the image information regarding the substrate G by capturing an image of the substrate G in the first direction 10, in which case, the vision module 125 may include a line scan camera. Also, the vision module 125 may acquire the image information regarding the substrate G by capturing images of areas of the substrate G having a predetermined size, in which case, the vision module may include an area scan camera.

The vision module 125 may be attached to the lower surface or a side surface of the gantry unit 130 to acquire the image information regarding the substrate G, but the present disclosure is not limited thereto. Alternatively, the vision module 125 may be attached to a side surface of the inkjet head unit 140. At least one vision module 125 may be provided in the substrate treatment apparatus 100 and may be fixedly or movably installed in the substrate treatment apparatus 100.

The gantry unit 130 supports the inkjet head unit 140. The gantry unit 130 may be provided above the first and second stages 111 and 121 such that the inkjet head unit 140 may eject the substrate treatment liquid onto the substrate G.

The gantry unit 130 may be provided above the first and second stages 111 and 121 to extend in the width direction of the first and second stages 111 and 121, i.e., in the second direction 20. The gantry unit 130 may move in the length direction of the first and second stages 111 and 121, i.e., in the first direction 10, along first and second guide rails 170*a* and 170*b*. The first and second guide rails 170*a* and 170*b* may be provided on the outside of the first and second stages 111 and 121 in the length direction of the first and second stages 111 and 121, i.e., in the first direction 10.

Although not specifically illustrated in FIG. 1, the substrate treatment apparatus 100 may further include a gantry moving unit. The gantry moving unit may allow the gantry unit 130 to slidably move along the first and second guide rails 170*a* and 170*b*. The gantry moving unit may be installed in the gantry unit 130.

The inkjet head unit 140 ejects the substrate treatment liquid onto the substrate G in the form of droplets. The inkjet head unit 140 may be installed on a side surface or the lower surface of the gantry unit 130.

At least one inkjet head unit 140 may be installed in the gantry unit 130. In a case where multiple gantry units 130 are installed in the inkjet head unit 140, the multiple gantry units 130 may be arranged in a row in the length direction of the gantry unit 130, i.e., in the second direction 20. The multiple inkjet head units 140 may operate independently or collectively.

The inkjet head unit 140 may move along the length direction of the gantry unit 130 i.e., along the second direction 20, to be located at each desired position on the substrate G, but the present disclosure is not limited thereto. Alternatively, the inkjet head unit 140 may move along the height direction of the gantry unit 130, i.e., along the third direction 30, or may rotate clockwise or counterclockwise.

The inkjet head unit 140 may be fixedly installed at the gantry unit 130, in which case, the gantry unit 130 may be movably provided.

Although not specifically illustrated in FIG. 1, the substrate treatment apparatus 100 may further include an inkjet head moving unit. The inkjet head moving unit may allow the inkjet head unit 140 to move rectilinearly or rotate.

The substrate treatment liquid supply unit 150 is a reservoir providing the substrate treatment liquid to the inkjet head unit 140. The substrate treatment liquid supply unit 150 may be installed in the gantry unit 130 and may include a storage tank 151 and a pressure control module 152.

The storage tank 151 stores the substrate treatment liquid, and the pressure control module 152 controls the pressure in the storage tank 151. The storage tank 151 may supply an appropriate amount of substrate treatment liquid to the inkjet head unit 140 based on the pressure provided by the pressure control module 152.

The substrate treatment liquid supply unit 150 and the inkjet head unit 140 may form an integral module together. For example, the inkjet head unit 140 and the substrate treatment liquid supply unit 150 may be disposed at the front of the gantry unit 130, and the substrate treatment liquid supply unit 150 may be disposed on a higher level than the inkjet head unit 140. However, the present disclosure is not limited to this example. The substrate treatment liquid supply unit 150 and the inkjet head unit 140 may be provided as separate modules. For example, the inkjet head unit 140 and the substrate treatment liquid supply unit 150 may be disposed at the front and the rear, respectively, of the gantry unit 130.

The control unit 160 controls the general operations of the other elements of th substrate treatment apparatus 100. The control unit 160 may control the operations of, for example, the air holes 112 and the gripper of the process treatment unit 110, the vision module 125 of the maintenance unit 120, the gantry unit 130, the inkjet head unit 140, and the pressure control module 152 of the substrate treatment liquid supply unit 150.

The control unit 160 may be implemented as a computer or a server including a process controller, a control program, an input module, an output module (or a display module), and a memory module. The process controller may include a microprocessor executing control functions for the elements of the substrate treatment apparatus 100, and the control program may execute various processes of the substrate treatment apparatus 100 under the control of the process controller. The memory module stores programs (i.e., process recipes) for executing the various processes of the substrate treatment apparatus 100 in accordance with various data and process conditions.

The control unit 160 may perform maintenance and repair for the inkjet head unit 140. The control unit 160 may correct the substrate treatment liquid ejection position of each of the nozzles of the inkjet head unit 140, or may detect any defective nozzles (i.e., nozzles failing to eject the substrate treatment liquid) and perform cleaning on the detected defective nozzles, based on the results of the measurement performed by the maintenance unit 120.

Figure 2:
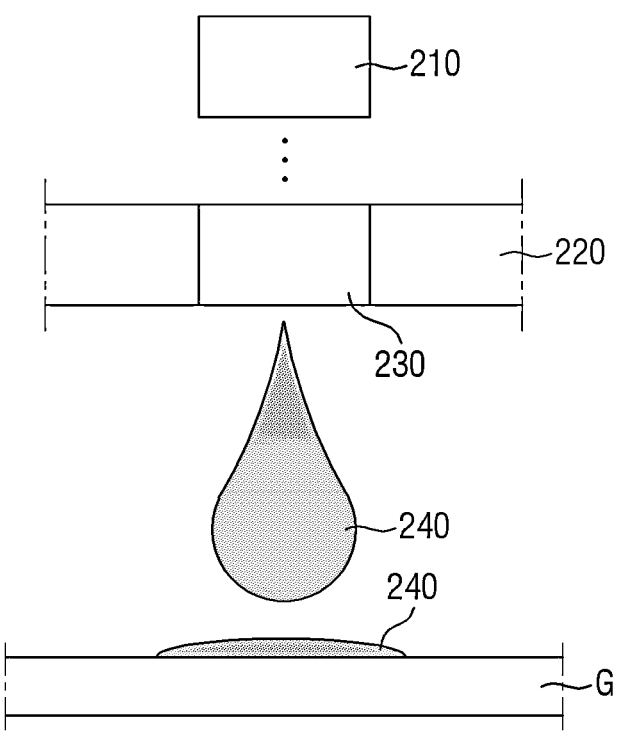
FIG. 2 is a schematic view illustrating an operating method of the substrate treatment apparatus of FIG. 1.
Figure 2:
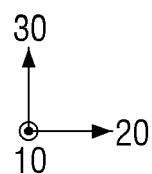

The substrate treatment apparatus 100 may be a piezoelectric inkjet printing system. In this case, referring to FIG. 2, the substrate treatment apparatus 100 may drop a substrate treatment liquid 240 in the form of droplets through nozzles 230 of the inkjet head unit 140 in accordance with a voltage applied to each piezoelectric element 210. FIG. 2 is a schematic view illustrating an operating method of a substrate treatment apparatus according to an embodiment of the present disclosure.

In a case where the substrate treatment apparatus 100 is a piezoelectric inkjet printing system, the inkjet head unit 140 may include piezoelectric elements 210, a nozzle plate 220, and a plurality of nozzles 230. The nozzle plate 220 forms the body of the inkjet head unit 140. The nozzles 230, for example, 128 or 256 nozzles 230, may be provided at the bottom of the nozzle plate 220 to be arranged at regular intervals in multiple rows and multiple columns, and as many piezoelectric elements 210 as there are nozzles 230 may be provided in the nozzle plate 220. In this case, the substrate treatment liquid 240 may be ejected onto the substrate G through the nozzles 230 in accordance with the operation of the piezoelectric elements 210.

The inkjet head unit 140 may control the amount by which the substrate treatment liquid 240 is ejected from each of the nozzles 230, independently in accordance with voltages applied to the piezoelectric elements 210.

As already mentioned above, a drop watcher system simply infers the shape of a meniscus from the contrast ratio of an image, but may not be able to accurately measure and quantify the shape, motion, and position of a meniscus.

A droplet analysis unit 300 capable of measuring and digitizing the meniscus shape, motion, and position of ink droplets will hereinafter be described.

The droplet analysis unit 300 is a device for measuring the meniscus motion of ink droplets. Although not specifically illustrated in FIG. 1, the droplet analysis unit 300 may be disposed in space (i.e., a maintenance zone) where the maintenance and repair of the inkjet head unit 140 are performed by the maintenance unit 120 and may be used to inspect droplets.

The droplet analysis unit 300 may be provided as a three-dimensional (3D) surface profiler-based meniscus measuring instrument. The droplet analysis unit 300 may obtain and provide a 3D image of a meniscus and may quantify the shape, motion, and position of the meniscus based on the 3D image. Also, the droplet analysis unit 300 may quantify the pressure of a meniscus, or oscillation by circulating flow.

Figure 3:
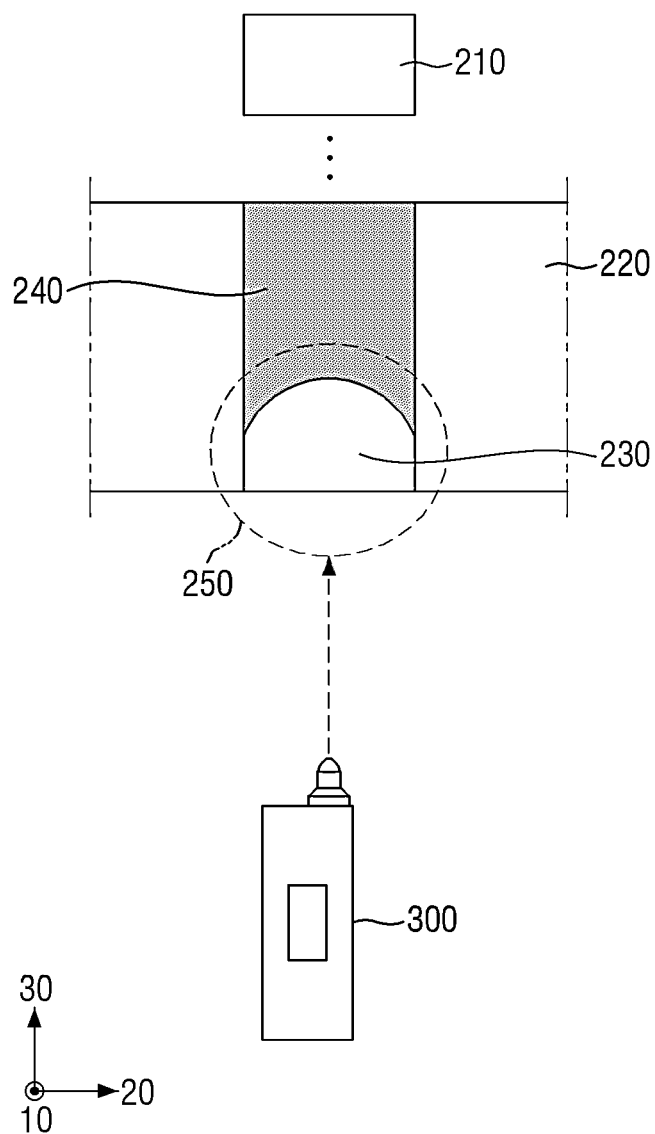
FIG. 3 is a schematic view illustrating the role of an exemplary droplet analysis unit of the substrate treatment apparatus.

The droplet analysis unit 300 may acquire a 3D image of a meniscus 250 to quantify various information (e.g., shape, motion, and position) of the meniscus 250. Referring to FIG. 3, the meniscus 250 refers to a curved surface formed in each of the nozzles 230 of the inkjet head unit 140 by the surface of the substrate treatment liquid 240. The meniscus 250 may be formed by negative pressure applied to each of the nozzles 230. FIG. 3 is a schematic view for explaining the role of an exemplary droplet analysis unit 300 of the substrate treatment apparatus 100.

Figure 4:
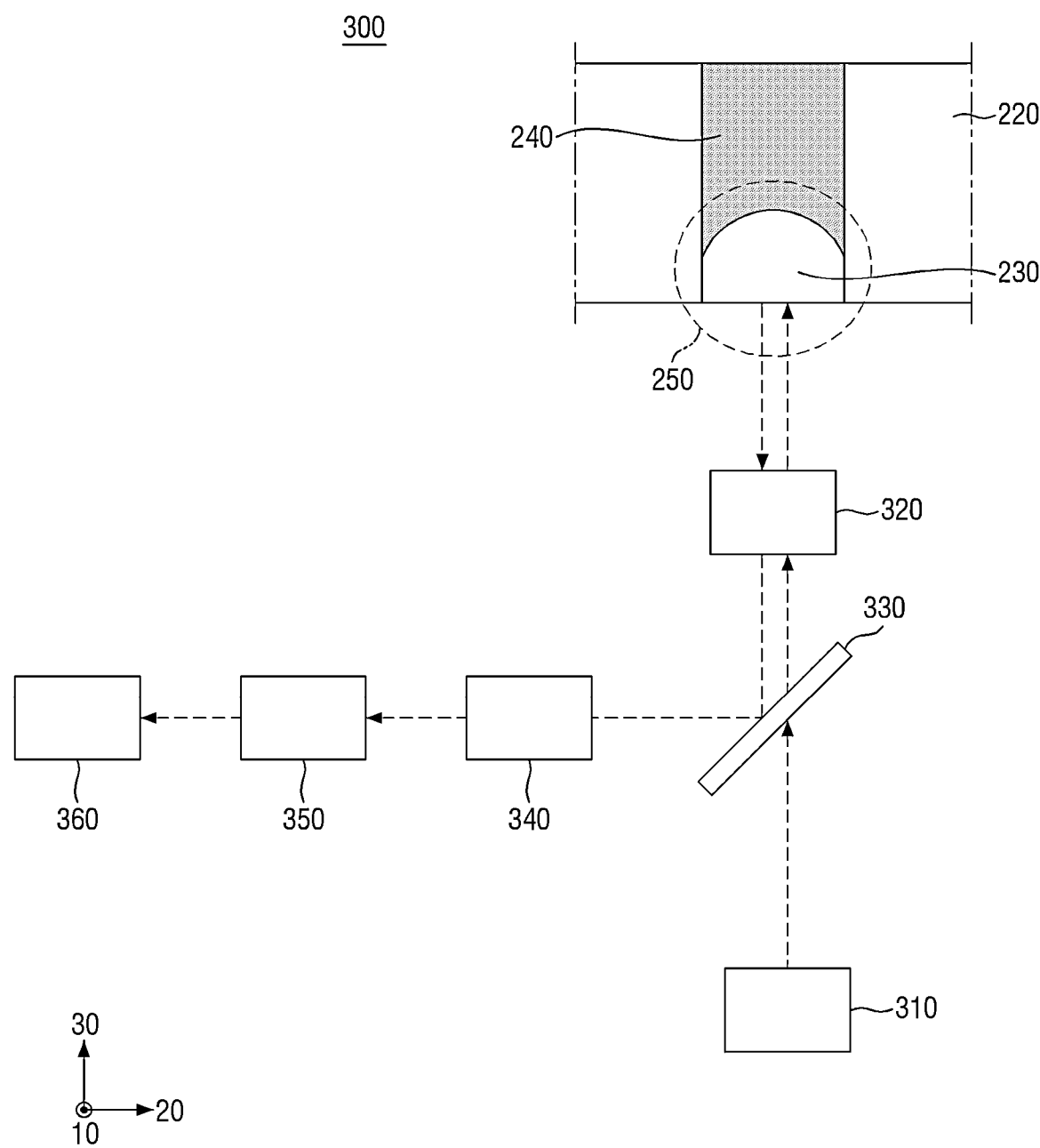
FIG. 4 is a first exemplary schematic view illustrating the internal modules of the droplet analysis unit as blocks.

As already mentioned above, the droplet analysis unit 300 may acquire a 3D image of the meniscus 250 using a chromatic aberration phenomenon and may quantify various information regarding the meniscus 250, such as the shape, motion, and position of the meniscus 250. Referring to FIG. 4, the droplet analysis unit 300 may include a light output module 310, a lens module 320, a light division module 330, a first filter 340, a light detection module 350, and an analysis module 360.

FIG. 4 is a first schematic view illustrating the internal modules of the droplet analysis unit 300 as blocks.

Referring to FIG. 4, the light output module 310 may output light. The light output module 310 may output white light using a chromatic aberration phenomenon to measure the meniscus 250 and may be provided as, for example, light-emitting diode (LED) light sources.

The light output module 310 may output a plurality of beams of light to acquire a 3D image of the meniscus 250. In this case, the light output module 310 may include a plurality of LED light sources. The LED light sources may be arranged in a row or in multiple rows. Alternatively, the LED light sources may be regularly or irregularly arranged to be spaced apart from one another.

Figure 5:
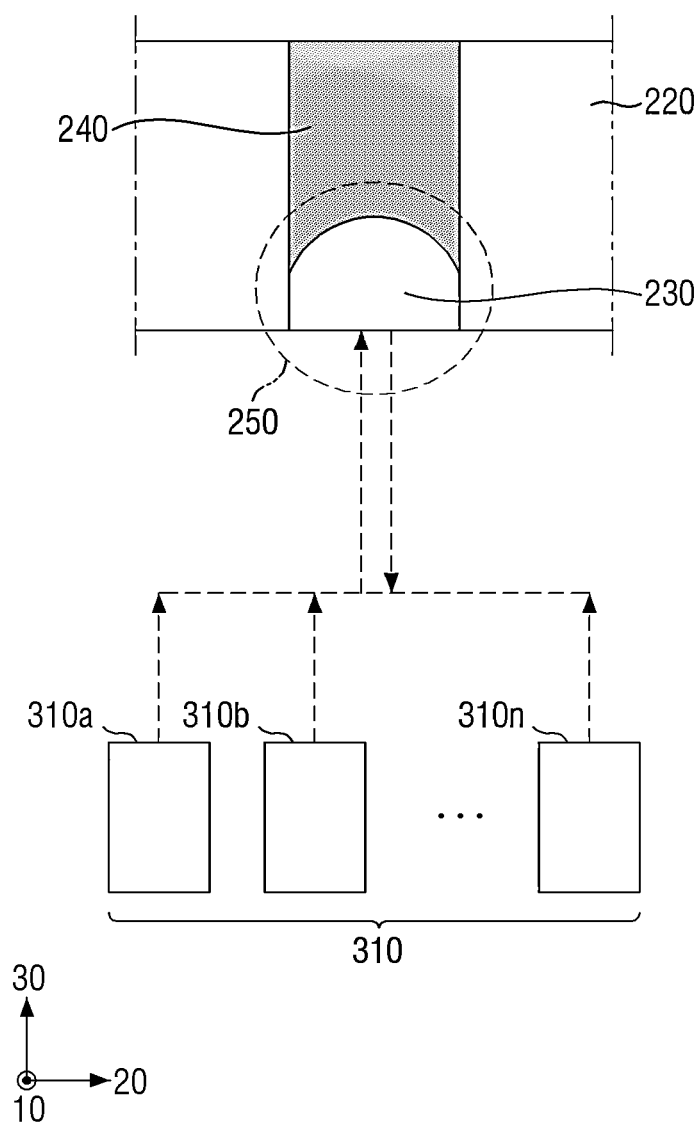
FIG. 5 is a schematic view illustrating the layout of a light output module of the droplet analysis unit.

Referring to FIG. 5, in a case where the light output module 310 includes a plurality of LED light sources 310a, 310b, . . . , and 310n, the LED light sources 310a, 310b, . . . , and 310n may be arranged in a direction perpendicular to the direction in which the substrate treatment liquid 240 drops from each of the nozzles 230, i.e., in the first or second direction 10 or 20. FIG. 5 is a schematic view illustrating the layout of the light output module 310 of the droplet analysis unit 300.

Referring again to FIG. 4, the lens module 320 causes chromatic aberration using the light output by the light output module 310. The lens module 320 may be disposed between the light division module 330 and a target object (e.g., the meniscus 250) to be measured. The light colleting module 320 may be provided as, for example, an optical lens. The lens module 320 may also deliver reflected light from the target object to the light division module 330.

The light division module 330 guides light toward the target object or the light detection module 350. Specifically, the light division module 330 may transmit the light output by the light output module 310 therethrough to be delivered toward the target object through the lens module 320 and may reflect the reflected light from the target object toward the light detection module 350.

The light division module 330 may be formed at a predetermined angle with respect to the moving direction of light to change the moving direction of the light. For example, the light division module 330 may be formed at an acute or obtuse angle with respect to the moving direction of light. The light division module 330 may be provided as, for example, a beam splitter or as, for example, a dichroic mirror.

The first filter 340 guides light transmitted through the light division module 330 toward the light detection module 350. The first filter 340 may guide only some of the beams of light transmitted through the light division module 330 toward the light detection module 350. The filter 340 may include at least one pin hole such as, for example, at least one confocal pin hole, and may be provided as, for example, a spatial filter.

The light detection module 350 may detect reflected light from the target object, having information regarding the target object. The light detection module 350 may detect light transmitted through the pin hole of the first filter 340 and may be provided as, for example, a light detector.

The analysis module 360 analyzes the spectrum of light detected by the light detection module 350. The analysis module 360 may include a spectrum analyzer such as, for example, a spectrometer.

The analysis module 360 may create a 3D image of the meniscus 250 based on the result of the analysis of the spectrum of the detected light. Also, the analysis module 360 may quantify various information regarding the meniscus 250 such as the shape, motion, and position of the meniscus 250.

As already mentioned above, the light output module 310 may include the laser sources 310a, 310b, . . . , and 310n. For example, referring to FIG. 5, the light output module 310 may include a plurality of LED light sources 310a, 310b, . . . , and 310n arranged in a row in the direction perpendicular to the direction in which the substrate treatment liquid 240 drops from each of the nozzles 230, i.e., in the first or second direction 10 or 20.

Figure 6:
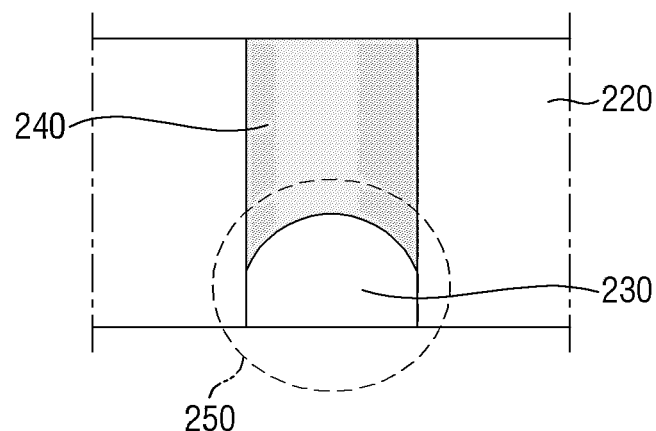
FIG. 6 is a first exemplary schematic view illustrating the functions of an analysis module of the droplet analysis unit.
Figure 6:
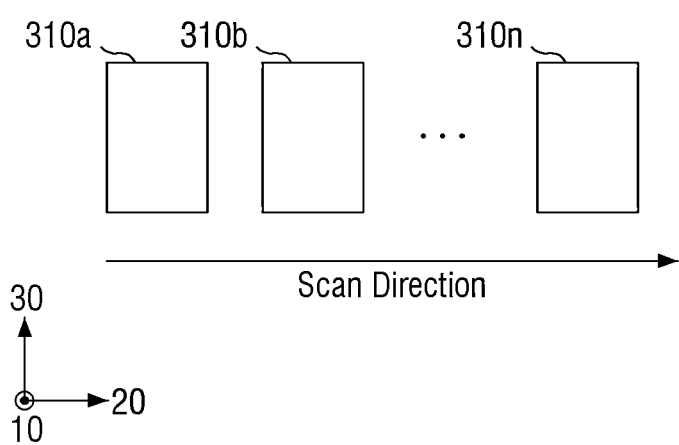

In this case, the analysis module 360 may acquire two-dimensional (2D) images of the meniscus 250 based on light output by each of the LED laser sources 310a, 310b, . . . , and 310n and may quantify a 3D image of the meniscus 250 by combining the 2D images. Referring to FIG. 6, the scan direction of the analysis module 360 for the target object may be parallel to the direction in which the nozzles 230 of the inkjet head unit 140 are arranged. FIG. 6 is a first exemplary schematic view illustrating the functions of the analysis module 360 of the droplet analysis unit 300.

Figure 7:
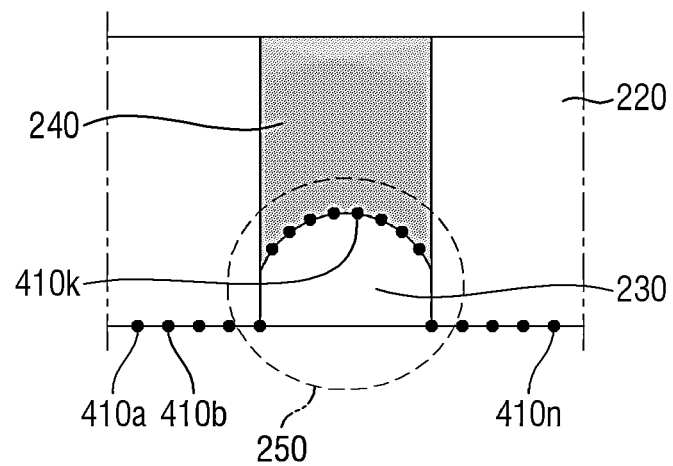
FIG. 7 is a second exemplary schematic view illustrating the functions of the analysis module of the droplet analysis unit.
Figure 7:
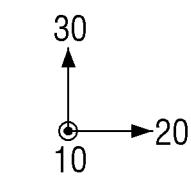

The analysis module 360 may quantify the position of the meniscus 250. For example, the analysis module 360 may quantify the position of the meniscus 250 by combining information regarding points 410a, 410b, . . . , 410k, . . . , and 410n. FIG. 7 is a second exemplary schematic view illustrating the functions of the analysis module 360 of the droplet analysis unit 300.

Figure 8:
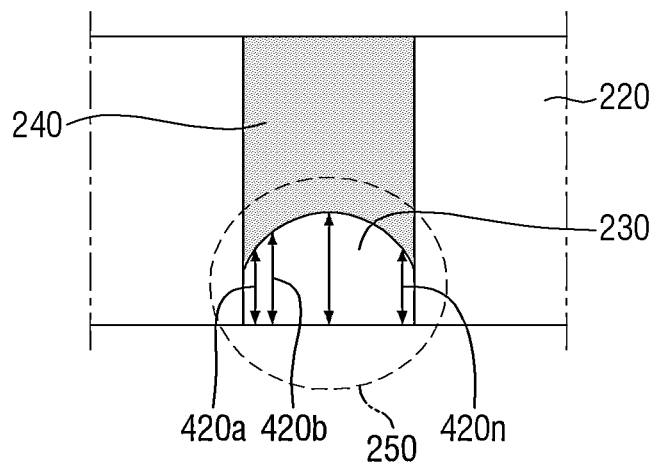
FIG. 8 is a third exemplary schematic view illustrating the functions of the analysis module of the droplet analysis unit.
Figure 8:
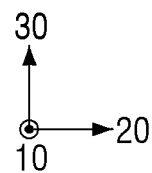

The analysis module 360 may also quantify the shape of the meniscus 250. For example, referring to FIG. 8, the analysis module 360 may quantify the shape of the meniscus 250 by combining information regarding heights 420a, 420b, . . . , and 420n from the end of each of the nozzles 230 to the surfaces of different parts of the meniscus 250. FIG. 8 is a third exemplary schematic view illustrating the functions of the analysis module 360 of the droplet analysis unit 300.

The analysis module 360 may quantify the position of the meniscus 250 using the method described above with reference to FIG. 8 and may quantify the shape of the meniscus 250 using the method described above with reference to FIG. 7.

Figure 9:
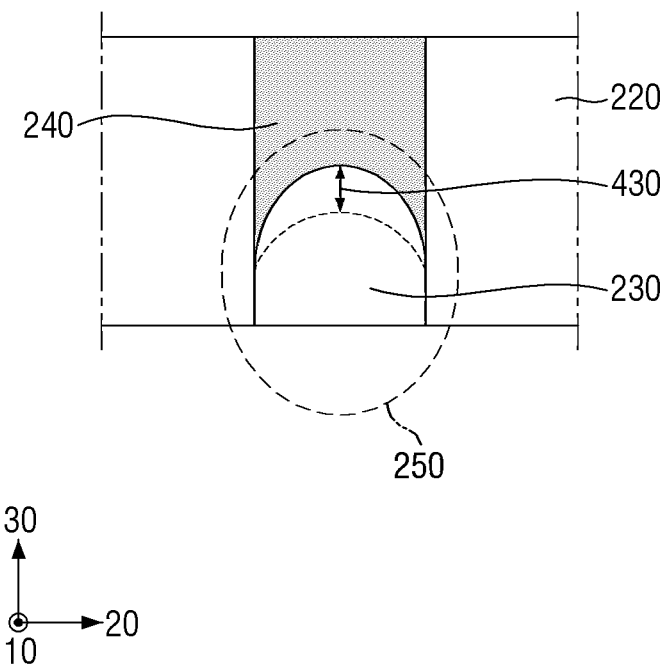
FIG. 9 is a fourth exemplary schematic view illustrating the functions of the analysis module of the droplet analysis unit.

The analysis module 360 may quantify the motion of the meniscus 250. When treating the substrate S, the inkjet head unit 140 may move along a head shaft, in which case, the motion of the meniscus 250 may change. Accordingly, referring to FIG. 9, 3D images of the meniscus 250 are acquired and quantified at regular intervals of time and are then sorted in chronological order, thereby digitizing a motion 430 of the meniscus 250. FIG. 9 is a fourth exemplary schematic view illustrating the functions of the analysis module 360 of the droplet analysis unit 300.

Figure 10:
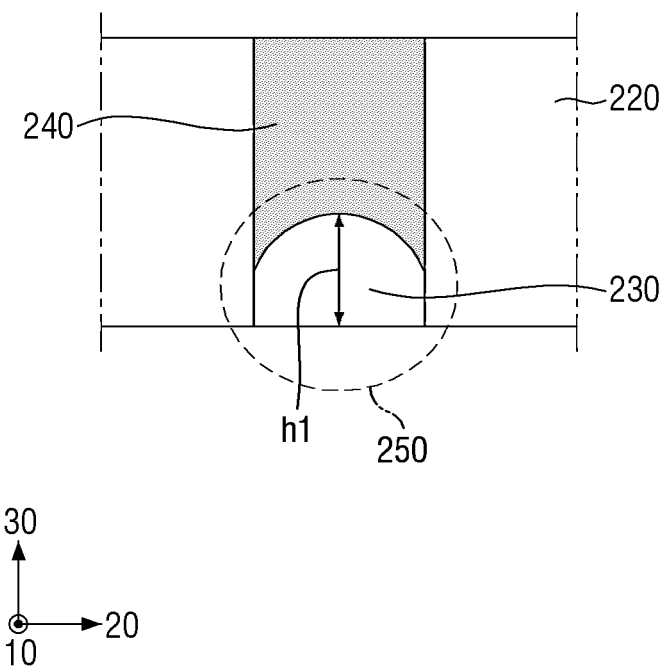
FIG. 10 is a fifth exemplary schematic view illustrating the functions of the analysis module of the droplet analysis unit.
Figure 11:
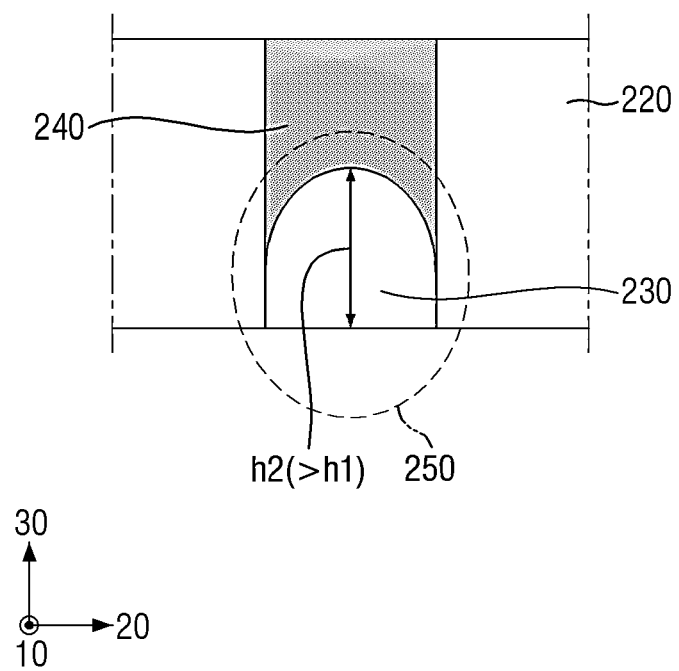
FIG. 11 is a sixth exemplary schematic view illustrating the functions of the analysis module of the droplet analysis unit.

A flow may occur depending on the pressure applied to each of the nozzles 230, and the motion 430 of the meniscus 250 may change accordingly. For example, the shape of the meniscus 250 may be as illustrated in FIG. 10, when the pressure applied to each of the nozzles 230 is −6 kpa, and may be as illustrated in FIG. 11, when the pressure applied to each of the nozzles 230 is −7 kpa. FIG. 10 is a fifth exemplary schematic view illustrating the functions of the analysis module 360 of the droplet analysis unit 300, and FIG. 11 is a sixth exemplary schematic view illustrating the functions of the analysis module 360 of the droplet analysis unit 300.

The pressure applied to each of the nozzles 230 may be generated by the pressure control module 152. Even in this case, the motion 430 of the meniscus 250 can be quantified based on 3D images of the meniscus 250.

The pressure applied to each of the nozzles 230 may also be generated by the circulating flow rate between the substrate treatment liquid supply unit 150 and the inkjet head unit 140 or the pulsation of a pump. If the circulating flow rate between the substrate treatment liquid supply unit 150 and the inkjet head unit 140 is fast, the pressure applied to each of the nozzles 230 may increase, and the shape of the meniscus 250 may change from that illustrated in FIG. 10 to that illustrated in FIG. 11. On the contrary, if the circulating flow rate between the substrate treatment liquid supply unit 150 and the inkjet head unit 140 is slow, the pressure applied to each of the nozzles 230 may increase, and the shape of the meniscus 250 may change from that illustrated in FIG. 11 to that illustrated in FIG. 10.

The droplet analysis unit 300 may measure the 3D shape and position of a meniscus 250 and may also measure the motion of the meniscus 250 resulting from vibration or crosstalk. The droplet analysis unit 300 may include the light output module 310, the lens module 320, the light division module 330, the first filter 340, the light detection module 350, and the analysis module 360 and may be provided as a confocal chromatic sensor (CCS)-based meniscus position/shape/motion (PSM) measuring instrument.

The droplet analysis unit 300 measures the position, shape, and motion of the meniscus 250 using a 3D surface profiler and can thus provide benefits in terms of mass production and speed, but the present disclosure is not limited thereto. Alternatively, the droplet analysis unit 300 may be provided as, for example, a 3D surface profiler-based meniscus PSM measuring instrument. The structure of the droplet analysis unit 300 is not particularly limited. The droplet analysis unit 300 may include one or more light output modules 310, one or more lens modules 320, one or more light division modules 330, one or more first filters 340, one or more light detection modules 350, and one or more analysis modules 360, and the numbers of light output modules 310, lens modules 320, light division modules 330, first filters 340, light detection modules 350, and analysis modules 360 may be the same or different. For example, the droplet analysis unit 300 may include two light output modules 310, i.e., first and second light output modules 310a and 310b, two lens modules 320, i.e., first and second lens modules 320a and 320b, two light division modules 330, i.e., first and second light division modules 330a and 330b, two first filters 340, i.e., first and second first filters 340, one light detection module 350, and one analysis module 360.

Figure 12:
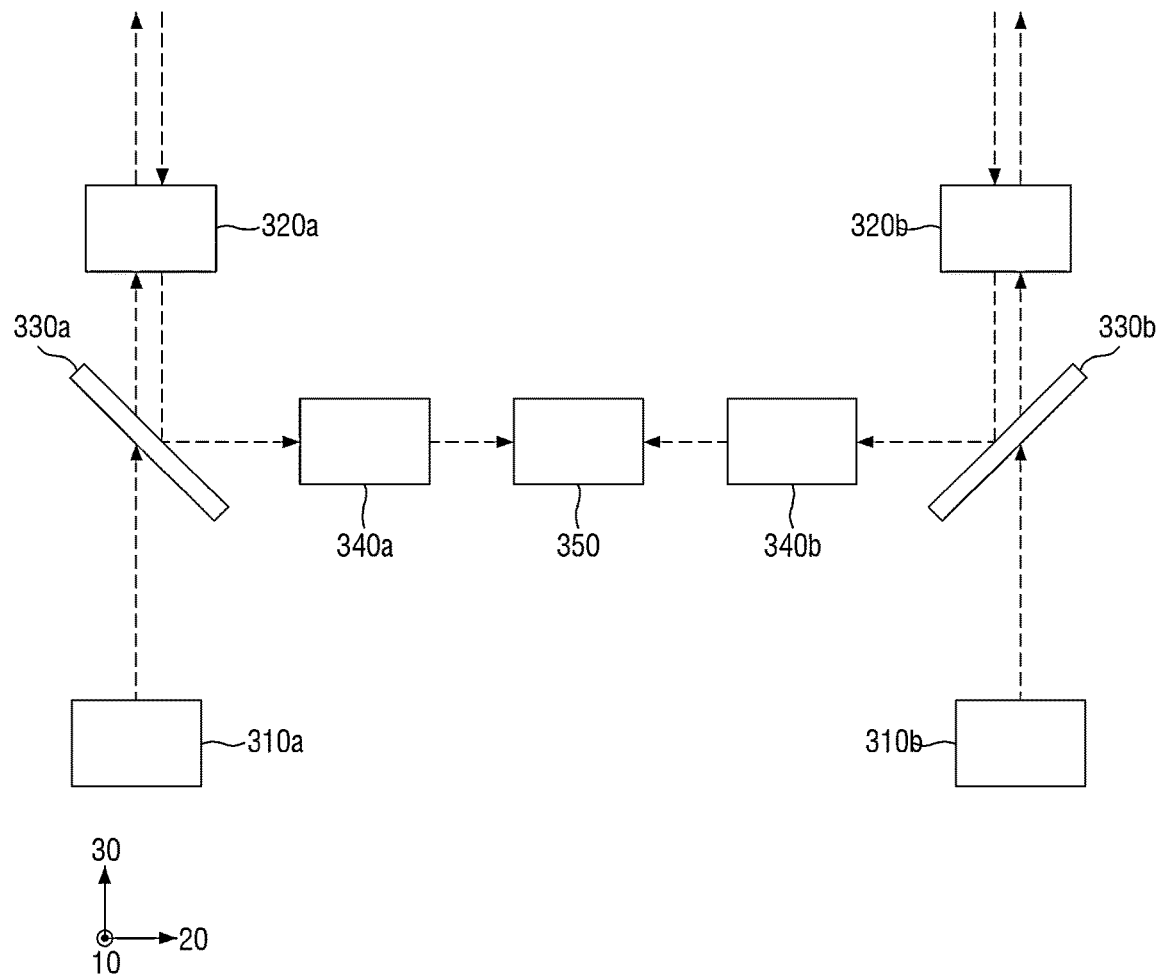
FIG. 12 is a schematic view illustrating exemplary first and second light division modules of the droplet analysis unit.

In this example, the first and second light division modules 330a and 330b may be formed at different inclinations. For example, referring to FIG. 12, the first light division module 330a may be formed at an acute angle with respect to the moving direction of reflected light, and the second light division module 330a may be formed at an obtuse angle with respect to the moving direction of the reflected light. FIG. 12 is a schematic view illustrating exemplary first and second light division modules 330a and 330b of the droplet analysis unit 300.

The droplet analysis unit 300 may be configured to further include a case capable of preventing contamination, cleaning any contaminants, and measuring the degree of cleanliness. For example, referring to FIG. 13, the droplet analysis unit 300 may include an image acquisition module 510, a lens module 520, a glass module 530, a cleaning liquid spray module 540, and a cleaning module 550.

Figure 13:
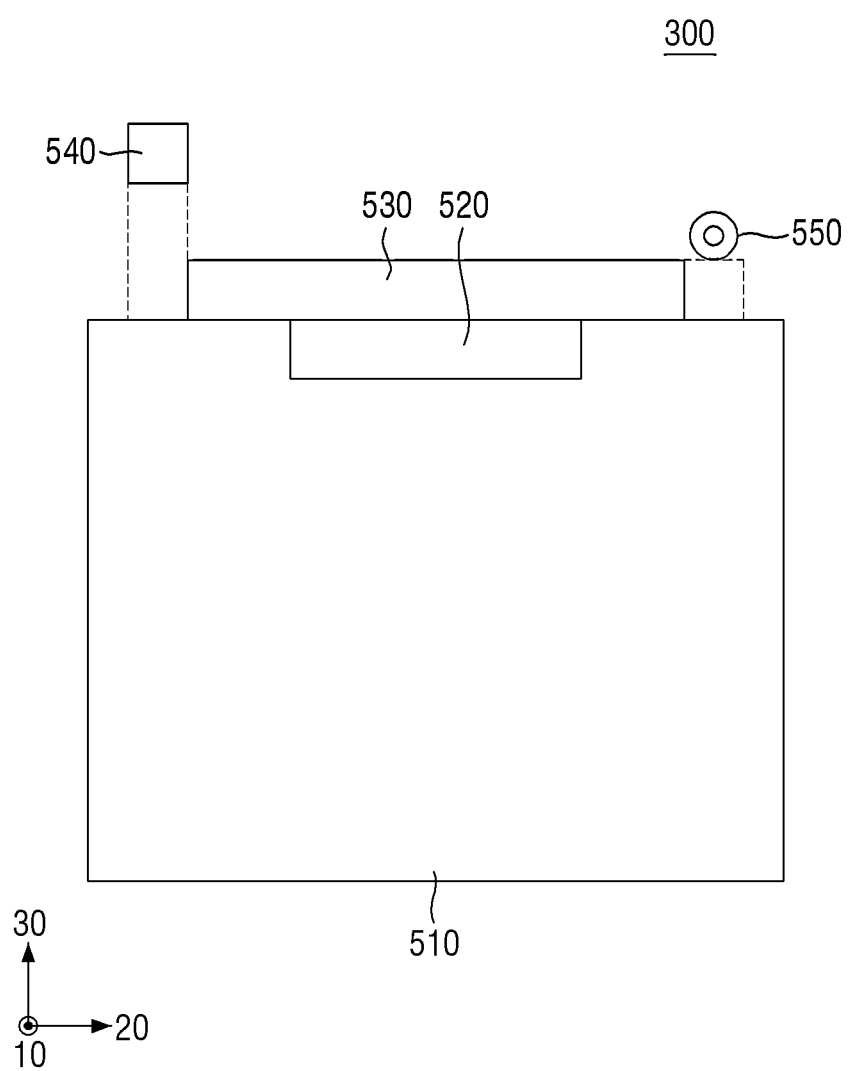
FIG. 13 is a first exemplary schematic view illustrating the internal structure of the droplet analysis unit.

FIG. 13 is a first exemplary schematic view illustrating the internal structure of the droplet analysis unit 300.

Referring to FIG. 13, the image acquisition module 510 acquires an image of a meniscus 250. The image acquisition module 510 may acquire a 3D image of the meniscus 250 using light output through the lens module 520 to quantify various information regarding the meniscus 250, such as the shape, motion, and position of the meniscus 250. The lens module 520 may be mounted in the image acquisition module 510 to be exposed on a side surface of the image acquisition module 510.

For example, the image acquisition module 510 may be configured to have a structure illustrated in FIG. 4. In another example, the image acquisition module 510 may be configured to have a structure illustrated in FIG. 12. In these examples, the lens module 520 may be an element of the light detection module 350.

The glass module 530 is formed to cover an outer exposed surface of the lens module 520. In order for the image acquisition module 510 to acquire an image of the meniscus 250, the lens module 520 may be exposed to the outside to measure the meniscus 250. However, if the lens module 520 is exposed, the lens module 520 may be damaged by external pressure or shock. The glass module 530 may protect the lens module 520 by covering the outer exposed surface of the lens module 520.

The glass module 530 may be formed to have a larger width than the outer exposed surface of the lens module 520, but the present disclosure is not limited thereto. However, the width of the glass module 530 is not particularly limited as long as the glass module 530 can properly protect the lens module 520. Alternatively, the glass module 530 may be formed to have the same width as the outer exposed surface of the lens module 530.

The glass module 530 may be formed of a material that cannot be easily damaged by external shock. The glass module 530 may be formed of, for example, quartz.

The cleaning liquid spray module 540 sprays a cleaning liquid onto the glass module 530. If the glass module 530 is exposed to the outside for a long period of time, the surface of the glass module 530 may become muddy with dust or the like. The cleaning liquid spray module 540 may spray a cleaning liquid onto the glass module 530 to clean the surface of the glass module 530.

Figure 14:
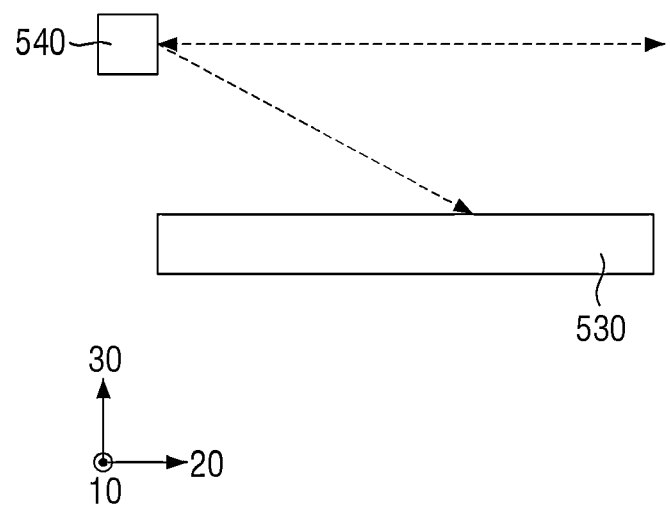
FIG. 14 is a schematic view illustrating the operating principles of a cleaning liquid spray module of FIG. 13.

The cleaning liquid spray module 540 may evenly spray the cleaning liquid on the entire surface of the glass module 530. The cleaning liquid spray module 540 may rotate to evenly spray the cleaning liquid on the entire surface of the glass module 530. Alternatively, referring to FIG. 14, the cleaning liquid spray module 540 may move back and forth over the glass module 530 to evenly spray the cleaning liquid on the entire surface of the glass module 530. FIG. 14 is a schematic view illustrating the operating principles of the cleaning liquid spray module 540.

Referring again to FIG. 13, when the cleaning liquid is provided onto the glass module 530, the cleaning module 550 may clean the surface of the glass module 530 with the cleaning liquid. The cleaning module 550 may be provided as a roller. The cleaning module 550 may be formed of a material that does not damage the surface of the glass module 530 when cleaning the glass module 530. The cleaning module 550 may be provided as, for example, a roller with a cloth wound thereon.

Figure 15:
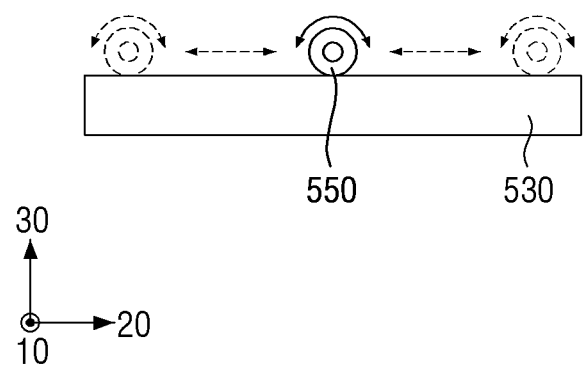
FIG. 15 is a schematic view illustrating the operating principles of a cleaning module of FIG. 13.

Referring to FIG. 15, the cleaning module 550 may rotate on the glass module 530 to clean the surface of the glass module 530. The cleaning module 550 may not rotate, but move back and forth rectilinearly, on the glass module 530. However, to minimize damage to the surface of the glass module 530, the cleaning module 550 may rotate back and forth on the glass module 530. FIG. 15 is a schematic view illustrating the operating principles of the cleaning module 550.

The cleaning liquid spray module 540 and the cleaning module 550 may be driven when the surface of the glass module 530 is muddy. The droplet analysis unit 300 may further include a transmittance measurement module 560 to determine whether the surface of the glass module 530 is muddy.

Figure 16:
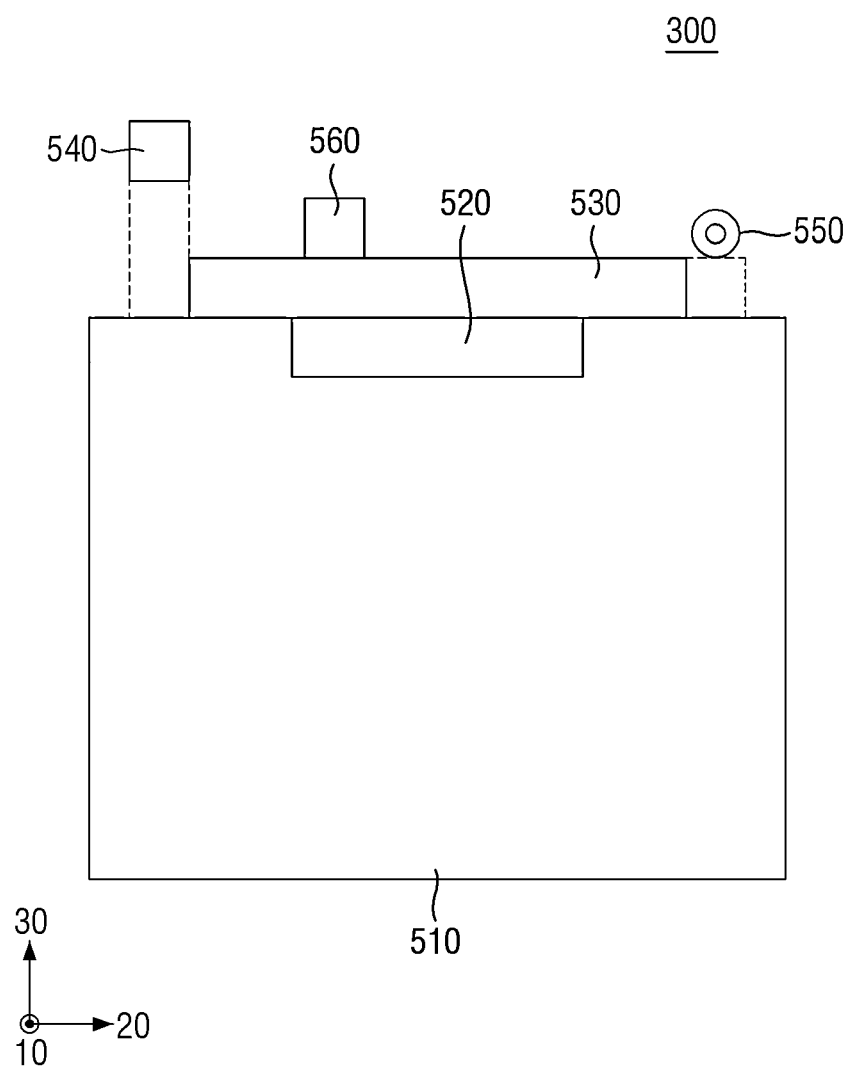
FIG. 16 is a second exemplary schematic view illustrating the internal structure of the droplet analysis unit.

FIG. 16 is a second exemplary schematic view illustrating the internal structure of the droplet analysis unit 300.

Referring to FIG. 16, the transmittance measurement module 560 measures the transmittance of the glass module 530. The transmittance measurement module 560 may be disposed on the glass module 530 and may be attachable to, or detachable from, the glass module 530.

The transmittance measurement module 560 may measure the transmittance of the surface of the glass module 530 at regular intervals of time. A determination may be made as to whether the surface of the glass module 530 is muddy by comparing the transmittance of the surface of the glass module 530, measured by the transmittance measurement module 560, with a reference value. The control unit 160 may determine whether the surface of the glass module 530 is muddy.

The cleaning liquid spray module 540 and the cleaning module 550 may be driven to clean the surface of the glass module 530 if the surface of the glass module 530 is determined as being muddy based on the transmittance of the surface of the glass module 530, measured by the transmittance measurement module 560.

The transmittance measurement module 560 may also measure the transmittance of the surface of the glass module 530 after the surface of the glass module 530 is cleaned by the cleaning liquid spray module 540 and the cleaning module 550. If the surface of the glass module 530 is determined as being still muddy even after being cleaned, the cleaning liquid spray module 540 and the cleaning module 550 may clean the surface of the glass module 530 again. These operations of the cleaning liquid spray module 540 and the cleaning module 550 may be repeated until the transmittance of the surface of the glass module 530 reaches or exceeds the reference value.

As already mentioned above, the droplet analysis unit 300 may be provided as a CCS-based meniscus PSM measuring instrument capable of measuring a meniscus using a CCS-based measurement method. In this case, the droplet analysis unit 300 can quantify, rather than infer, the position of a meniscus for evaluation and optimization. The droplet analysis unit 300 can measure the shape of a meniscus in accordance with a variety of process conditions and can also measure the motion of a meniscus resulting from vibration or crosstalk. The droplet analysis unit 300 can measure the 3D/2D shape and the position of a meniscus via a CCS and can thus quantify the position/shape/motion of a meniscus.

Figure 17:
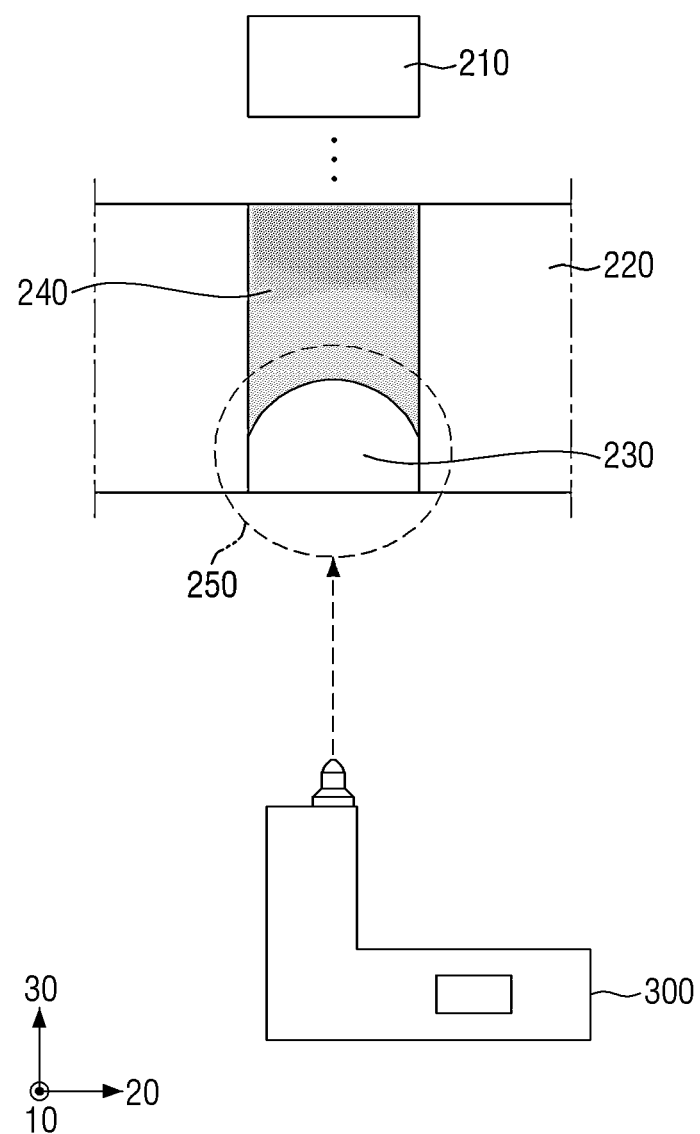
FIG. 17 is a schematic view illustrating another exemplary droplet analysis unit of the substrate treatment apparatus.

In a case where the droplet analysis unit 300 is provided as a CCS-based measuring instrument, the droplet analysis unit 300 can scan a meniscus in each nozzle 230, facing upward from below the corresponding nozzle 230, as illustrated in FIG. 3. In this case, the droplet analysis unit 300 may have an I shape. The type of the droplet analysis unit 300 is not particularly limited, and the droplet analysis unit 300 may have an L shape, instead of an I shape, as illustrated in FIG. 17. For example, referring to FIG. 17, the droplet analysis unit 300 may be disposed to face upward from a side of a nozzle 230. FIG. 17 is a schematic view illustrating another exemplary droplet analysis unit 300 of the substrate treatment apparatus 100.

By using the droplet analysis unit 300, the measurement of various images can be performed at once, and image data can be quickly acquired. Here, the various images include an optical image, a 2D image (position & shape), a 3D image, a 3D cross-sectional image, and the like.

Embodiments of the present disclosure have been described above with reference to the accompanying drawings, but the present disclosure is not limited thereto and may be implemented in various different forms. It will be understood that the present disclosure can be implemented in other specific forms without changing the technical concept or gist of the present disclosure. Therefore, it should be understood that the embodiments set forth herein are illustrative in all respects and not limiting.

What is claimed is:

1. A substrate treatment apparatus comprising:
   a process treatment unit supporting a substrate while the substrate is being treated;
   an inkjet head unit treating the substrate by ejecting a substrate treatment liquid onto the substrate using a plurality of nozzles;
   a gantry unit moving the inkjet head unit over the substrate; and
   a droplet analysis unit measuring a meniscus in each of the nozzles that is associated with the substrate treatment liquid,
   wherein the droplet analysis unit measures and quantifies three-dimensional (3D) information regarding the meniscus based on chromatic aberration.

2. The substrate treatment apparatus of claim 1, wherein the droplet analysis unit measures and quantifies a shape, a motion, and a position of the meniscus as the 3D information.

3. The substrate treatment apparatus of claim 1, wherein a scan direction of the droplet analysis unit for measuring the meniscus is parallel to a direction in which the nozzles are arranged.

4. The substrate treatment apparatus of claim 1, wherein the droplet analysis unit includes a light output module, which outputs light, a lens module, which guides the light toward the meniscus and causes the chromatic aberration, a light detection module, which detects the light, a light division module, which guides the light toward the lens module and guides reflected light from the meniscus toward the light detection module, a first filter, which is disposed between the light division module and the light detection module and includes at least one pin hole for transmitting the light therethrough, and an analysis module, which quantifies the 3D information regarding the meniscus by analyzing the light detected by the light detection module.

5. The substrate treatment apparatus of claim 4, wherein a plurality of light output modules are provided and are arranged perpendicularly to a direction in which the substrate treatment liquid drops.

6. The substrate treatment apparatus of claim 4, wherein the light division module guides the light toward the lens module and the meniscus, and guides reflected light from the meniscus toward the light detection module by transmitting the reflected light therethrough.

7. The substrate treatment apparatus of claim 4, wherein the light output module outputs white light in a direction toward each of the nozzles.

8. The substrate treatment apparatus of claim 4, wherein the light output module is formed at an inclination with respect to a moving direction of reflected light.

9. The substrate treatment apparatus of claim 4, wherein numbers of light output modules, lens modules, light division modules, and first filters included differ from a number of light detection modules included.

10. The substrate treatment apparatus of claim 9, wherein
    the number of light division modules is greater than the number of light detection modules, and
    a plurality of light division modules are formed at different inclination angles.

11. The substrate treatment apparatus of claim 1, wherein the droplet analysis unit includes an image acquisition module, which acquires a 3D image of the meniscus, a glass module, which covers an outer exposed surface of the image acquisition module, and a cleaning module, which cleans the surface of the glass module.

12. The substrate treatment apparatus of claim 11, wherein the droplet analysis unit further includes a cleaning liquid spray module, which sprays the cleaning liquid onto the glass module, and
    the cleaning module cleans the surface of the glass module with the cleaning liquid.

13. The substrate treatment apparatus of claim 12, wherein the cleaning liquid spray module rotates or rectilinearly moves back and forth on the glass module.

14. The substrate treatment apparatus of claim 12, wherein the cleaning liquid spray module and the cleaning module are driven when the surface of the glass module is muddy and are driven repeatedly until a transmittance of the glass module reaches and exceeds a reference value.

15. The substrate treatment apparatus of claim 11, wherein the droplet analysis unit further includes a transmittance measurement module, which measures the transmittance of the glass module.

16. The substrate treatment apparatus of claim 15, wherein a determination is made as to whether the surface of the glass module is muddy based on the transmittance of the glass module.

17. The substrate treatment apparatus of claim 15, wherein the transmittance measurement module measures the transmittance of the glass module after the surface of the glass module is cleaned.

18. A substrate treatment apparatus comprising:
- a process treatment unit supporting a substrate while the substrate is being treated;
- an inkjet head unit treating the substrate by ejecting a substrate treatment liquid onto the substrate using a plurality of nozzles;
- a gantry unit moving the inkjet head unit over the substrate; and
- a droplet analysis unit measuring a meniscus in each of the nozzles that is associated with the substrate treatment liquid, wherein
the droplet analysis unit measures and quantifies a shape, a motion, and a position of the meniscus based on chromatic aberration as three-dimensional (3D) information regarding the meniscus and includes an image acquisition module, which acquires a 3D image of the meniscus, a glass module, which covers an outer exposed surface of the image acquisition module, a transmittance measurement module, which measures a transmittance of the glass module, a cleaning liquid spray module, which sprays a cleaning liquid onto the glass module and is driven based on the transmittance of the glass module, and a cleaning module, which cleans the surface of the glass module with the cleaning liquid and is driven based on the transmittance of the glass module, and the image acquisition module includes a light output module, which outputs light, a lens module, which guides the light toward the meniscus and causes the chromatic aberration, a light detection module, which detects the light, a light division module, which guides the light toward the lens module toward the meniscus and guides reflected light from the meniscus toward the light detection module, a first filter, which is disposed between the light division module and the light detection module and includes at least one pin hole for transmitting the light therethrough, and an analysis module, which quantifies the 3D information regarding the meniscus by analyzing the light detected by the light detection module.

\* \* \* \* \*